(12) United States Patent
Low et al.

(10) Patent No.: US 8,338,828 B2
(45) Date of Patent: Dec. 25, 2012

(54) SEMICONDUCTOR PACKAGE AND METHOD OF TESTING SAME

(75) Inventors: Boon Yew Low, Petaling Jaya (MY); Teck Beng Lau, Petaling Jaya (MY); Vemal Raja Manikam, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 281 days.

(21) Appl. No.: 12/851,527

(22) Filed: Aug. 5, 2010

(65) Prior Publication Data

US 2012/0032167 A1   Feb. 9, 2012

(51) Int. Cl.
*H01L 23/58*   (2006.01)

(52) U.S. Cl. ... 257/48; 257/741; 257/773; 257/E23.023; 257/E23.067; 257/E23.179; 257/E21.506; 257/E21.522; 438/18; 438/613; 438/666

(58) Field of Classification Search ............ 257/48, 257/741, 773, E23.023, E23.067, E23.179, 257/E21.506, E21.522; 438/18, 613, 666
See application file for complete search history.

(56) References Cited

U.S. PATENT DOCUMENTS

| | | | |
|---|---|---|---|
| 5,625,221 A | 4/1997 | Kim | |
| 5,953,589 A | 9/1999 | Ohsumi | |
| 6,097,091 A | 8/2000 | Shim | |
| 6,291,260 B1 | 9/2001 | Huang | |
| 6,573,147 B2 | 6/2003 | Moon | |
| 7,211,995 B2 | 5/2007 | Ventomaki | |
| 2008/0001276 A1* | 1/2008 | Lee et al. | 257/686 |
| 2009/0321899 A1* | 12/2009 | Do et al. | 257/666 |

* cited by examiner

*Primary Examiner* — Tu-Tu Ho
(74) *Attorney, Agent, or Firm* — Charles Bergere (57) ABSTRACT

A packaged integrated circuit includes a substrate having a wire layout pattern and a solder mask layer. An integrated circuit attached to a surface of the substrate is electrically connected to the wire layout pattern. An encapsulation material covers at least the integrated circuit and the solder mask layer. One or more crack seal rings are disposed on the solder mask surface. The crack seal rings are copper traces with terminals that allow current to be applied to the traces. A broken trace (open circuit condition) is indicative of a crack in the package. Thus, electrical testing is performed to detect physical defects.

10 Claims, 5 Drawing Sheets

SEMICONDUCTOR PACKAGE AND METHOD OF TESTING SAME

BACKGROUND OF THE INVENTION

The present invention relates to semiconductor packages and methods of fabrication thereof, and more particularly, to methods of testing a semiconductor package.

Quality is a very important factor in the automated manufacturing of products, such as semiconductor packages. Semiconductor packages having defects at edges of the packages are responsible for a relatively high proportion of returned PBGA (plastic ball grid array) or similar semiconductor packages. One cause of such defects/faults includes damage caused by operator mishandling such as dropping or bending, which can cause cracking of the package. If such damage is minor, that is, it is not noticed by the operator and the package is subsequently used in a manufacturing process, delamination of layers within the package may occur. Delamination may occur for other reasons too. For instance, delamination may arise from irregularities in formation of layers of the package. Such minor cracks and delamination effects are very hard to detect, especially after the parts have been subjected to subsequent assembly processes, such as encapsulation or molding.

Some previous efforts to obviate and/or minimize the effects of such damage include forming a physical barrier in a layer of a package so that any cracks that may appear in an outer edge of the package do not propagate from the package edge inwards towards the center of the package.

The above approach still falls far short of being an optimal solution since the manufacturing process is complicated by the addition of the barrier. Additionally, this technique has limited effect in obviating delamination caused by irregularities in the formation of layers of the semiconductor package.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE INVENTION

In one embodiment, the present invention provides a semiconductor package including a substrate and a plurality of electrical conductors on a surface of the substrate for conducting electrical current between a die and a plurality of solderballs. A protective layer is formed on the surface of the substrate to protect the electrical conductors. The protective layer includes a test electrical conductor.

In another embodiment, the present invention provides a method of assembling or packaging a semiconductor device. The semiconductor package includes a substrate having a plurality of electrical conductors on a surface thereof. The electrical conductors are provided for conducting electrical current between a die and a plurality of solderballs. A protective layer is formed on the surface of the substrate to protect the electrical conductors. The protective layer also is provided with a test electrical conductor.

In another embodiment, the present invention provides an integrated circuit package having a substrate including a wire layout pattern and a soldermask layer. An integrated circuit (semiconductor die) is attached to a surface of the substrate and is electrically connected to the wire layout pattern. Encapsulation material covers at least the integrated circuit and the soldermask layer. A plurality of crack seal rings is formed on the solder mask surface. The crack seal rings comprise copper traces. In one embodiment, the plurality of crack seal rings includes a first ring, at least a portion of which is formed proximate to an edge of the soldermask layer, for detecting soldermask cracks and a second ring, at least a portion of which is formed proximate to the wire layout pattern, for detecting delamination between the encapsulation material and the solder mask surface. A plurality of terminals is connected to the crack seal rings for permitting electrical connection to the crack seal rings.

In another embodiment, a method of testing a semiconductor package is provided. The package comprises a substrate and a plurality of electrical conductors provided on a surface of the substrate. The plurality of electrical conductors is provided for conducting electrical current between a die and a plurality of external electrical connectors such as solder balls. A protective layer is formed on the surface of the substrate for protecting the electrical conductors. The protective layer comprises a test electrical conductor. The method comprises applying a voltage to the test electrical conductor.

Implementation of the techniques disclosed herein may allow for robust detection of very small or minute cracks in a protective layer of a semiconductor package and/or delamination between layers of the semiconductor package. In embodiments of the invention, the protective layer is a solder mask layer. In alternative embodiments of the present invention, the protective layer is a layer of solder resist, but other types of protective layer are also contemplated. Application of a voltage to the test electrical conductor may determine whether the conductor is damaged or not. If, say, a digital multi-meter is used to apply a voltage to the conductor, then detection of an open-circuit condition may indicate that the test electrical conductor is damaged (for example, broken) which may be caused by defects in the package. The defects are possibly attributable to the protective layer cracking and/or delamination of layers of the semiconductor package. If a short-circuit condition is detected upon application of the voltage (for example, from the digital multi-meter) then the test conductor may not be damaged and the package may be in good order.

One embodiment of the invention allows detection of cracks at edges of the protective layer which, after the semiconductor package has been encapsulated with a mold material, will be adjacent the mold material. One embodiment of the invention allows for detection of delamination between the encapsulating material and the semiconductor package.

The invention provides for a new use of short circuit testing of a semiconductor package. In the context of the semiconductor industry, short- and/or open-circuit testing is usually applied at the die level for testing of electrical functionality or electrical failure or for detecting missing or damaged solder balls. However, for very small gaps of interfacial separation between two layers in a semiconductor package, or minute cracks in a layer of the semiconductor package, such defects cannot be detected using existing techniques. Use of an embodiment of the invention may allow for detection of tiny polymer-polymer interfacial separation because such defects may damage a test electrical conductor in accordance with embodiments of the invention, thereby causing breaking of the conductor so that, when a voltage is applied to the conductor, an open-circuit condition is detected.

In comparison with known techniques, the area of focus of the techniques disclosed herein are directed more to a level of components within the semiconductor package, rather than to an integrated circuit (IC) level and/or the circuit board interconnect level.

The invention has particular, but not exclusive, application with "organic substrates" such as MAP (molded array process) BGA, TBGA and TBGA (tape ball grid array) substrates. As used herein, the term organic when used in the context of an organic material or organic substrate, has a meaning that includes non-metallic materials. One group of suitable "organic materials" is polymer-based materials. The organic substrate may be considered to be a substrate, that is, the base material of a printed circuit board (PCB) that comprises of fiberglass, SRBP, FR4, CEM1, Polyimide, Duroid and Teflon™ or other like materials. In some embodiments, copper plating traces and a subsequent coating (such as a solder resist or a solder mask) is applied to one or both of the top or bottom surfaces of the substrate.

Solder mask or solder resist is a lacquer like layer of polymer that can be used to provide a permanent protective coating for the copper traces of a printed circuit board (PCB) and to prevent solder from bridging between conductors, thereby preventing short circuits. Solder mask is used to facilitate wave soldering used in mass assembly. The solder mask is most often applied with a green tint but is available in a wide variety of colors and finishes. It also provides some protection from the environment.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to distinguish between the elements such terms describe. Thus, these terms are not necessarily intended to indicate temporal or other prioritization of such elements.

Because the semiconductor package implementing the present invention is, for the most part, composed of semiconductor package components known to those skilled in the art, some package details will not be explained in any greater extent than that considered necessary for the understanding and appreciation of the underlying concepts of the present invention and in order not to obfuscate or distract from the teachings of the present invention.

Some of the embodiments may be implemented using a variety of different techniques. For example, although the figures and the discussion thereof describe a substrate comprised of glass fibers and epoxy resin, this exemplary substrate is presented merely to provide a useful reference in discussing various aspects of the invention; some suitable types of substrates are mentioned above. Of course, the description of the substrate (and the other layers of the semiconductor package) has been simplified for purposes of discussion, and it is just one of many different types of appropriate substrates that may be used in accordance with the invention. Similar comments apply also to the protective layer and the type of test electrical conductor. Those skilled in the art will recognize that specifics relating to these components are merely illustrative and that alternative embodiments may utilize different types of substrates, protective layers, or electrical conductors.

Figure 1A:
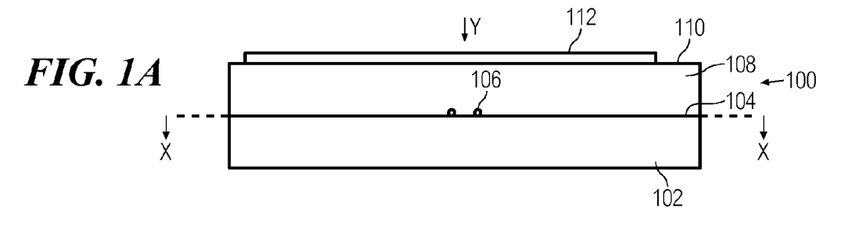
FIG. 1A is a cross-sectional side view of a semiconductor package in accordance with an embodiment of the present invention.
Figure 1B:
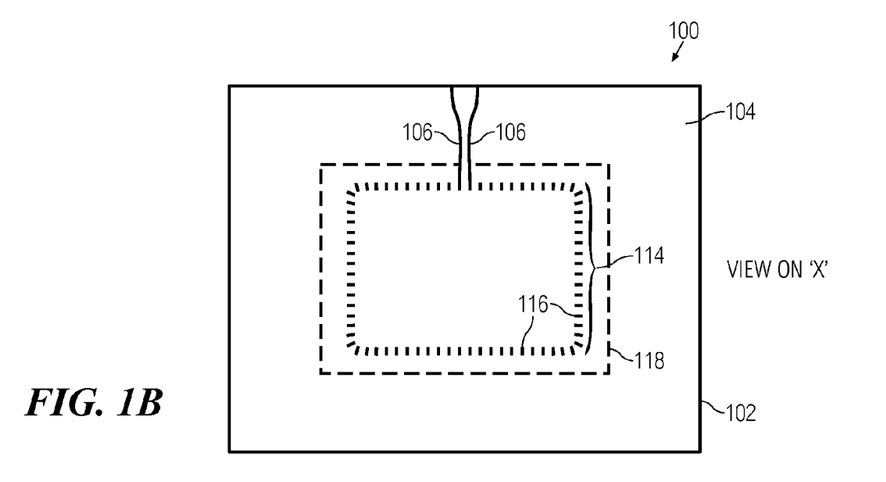
FIG. 1B is an enlarged cross-sectional view of the semiconductor package of FIG. 1A taken along line X-X.
Figure 1C:
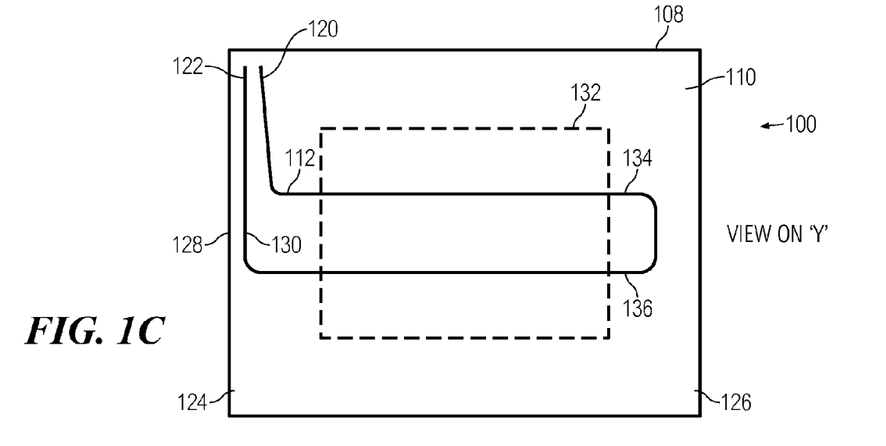
FIG. 1C is a top plan view of the semiconductor package of FIG. 1A as a view on Y.

Referring now to FIG. 1, the figure comprises three views: FIG. 1A provides a sectional view of a semiconductor package 100; FIG. 1B provides a view on "X" as shown in FIG. 1A, illustrating surface 104 of substrate 102 as viewed from above in the perspective of FIG. 1A; and FIG. 1C provides a view on "Y" as shown in FIG. 1A, illustrating the surface 110 of protective layer 108 as viewed from above in the perspective of FIG. 1A.

Looking first at FIG. 1A, a semiconductor package 100 comprises a substrate 102 having a surface 104. A plurality of electrical conductors 106 is formed on the surface 104 of the substrate 102 for conducting electrical current between a die (not shown) and a plurality of solder balls (not shown). A protective layer 108 is formed on the surface 104 of the substrate 102 for protecting the electrical conductors 106. The protective layer 108 has a surface 110. In the embodiment of FIG. 1, a test electrical conductor 112 is provided on the surface 110 of the protective layer 108. Methods of formation of the test electrical conductor 112 will be discussed below.

The substrate 102 is described in more detail with reference to FIG. 2. The protective layer 108 is, in the embodiment of FIG. 1, formed of a solder mask material formed on the surface 104 of the substrate 102 by any one of known techniques. The solder mask 108 acts as a protective layer for the conductors 106 and also as an electrical insulator minimizing the risk of short-circuits between the electrical conductors 106, but other types of material may be provided to protect and insulate the electrical conductors 106. In alternative embodiments of the invention, the protective layer 108 can be certain types of molds such as lid-type molds, pre-molds and cured caps and the techniques described used to detect defects therein.

When the protective layer 108 is formed of a solder mask material, the solder mask used may be of a different grade of solder mask for use in the masking of areas to be soldered. Typically, solder masks that may be used with the present invention are organic solder masks of varying grades from Taiyo America Inc., such as grades PSR-4000 AUS5, PSR-4000 AUS308, PSR-4000 AUS303, PSR-4000 AUS320 and PSR-4000 AUS703.

As shown in FIG. 1B, the conductors 106 of the present embodiment (only two of which are shown for the sake of clarity) are formed on the surface 104 of the substrate 102. In FIG. 1A, the conductors 106 are shown as being on the surface 104 of the substrate 102, however, it also should be appreciated that the conductors 106 may be partially embedded within the substrate 102.

In the embodiment of FIG. 1, the conductors 106 comprise "plating traces" for conducting electrical current between a die (not shown) and solder balls (not shown). In the present disclosure, use of the term "conducting electrical current" is intended to encompass the transmission of electrical signals and/or the conduction of electrical power between the die and the solder balls.

An array (or other collective) 114 of terminals 116 is provided for the conductors 106 in a first ("terminal") region 118 of the substrate 102. Alternatively, the "first region" can be considered to be any sub-region of region 118 and is intended to cover a region of the substrate 102 where one or more terminals for the conductors 106 is/are disposed.

The view on "Y" of FIG. 1A shown in FIG. 1C illustrates a top view of the package. Use of the term top is not limited and is used for convenience only. For instance, the reverse arrangement is possible where, in the perspective of a viewer, a protective layer is formed on an underside of the substrate.

In the present embodiment, the test electrical conductor 112 comprises a copper trace formed on the surface 110 of the protective layer 108 by a sputtering process. In the embodiment of FIG. 1, the copper trace has a width of the order of 100μ (microns) and a depth of the order of 5μ (microns), but other dimensions are contemplated. Of course, other techniques for the formation of the test electrical conductor 112, such as screen printing, or attaching a thin conductive film, such as a gold or copper film, to the protective layer surface may be utilized.

Any deformation or damage to the semiconductor package 100 may cause subsequent damage to the test electrical conductor 112. The state, whether damaged or not, of the test electrical conductor 112 may be indicative of the state of a layer of semiconductor package 100 as will be discussed in further detail below.

In embodiments of the invention, it is not necessary that the test electrical conductor 112 be formed on the surface 110 of the protective layer 108. For instance, in other embodiments, the test electrical conductor 112 may be embedded within the protective layer 108. That is, the protective layer 108 encloses, at least partially, the test electrical conductor 112.

In the embodiment of FIG. 1, the test electrical conductor 112 comprises a loop that traverses around the surface 110 of the protective layer 108 such that the conductive path starts at one point on the surface of the protective layer 108, loops around the surface and back to the vicinity of the starting point. The est electrical conductor 112 comprises first and second ends 120, 122 between which the test electrical conductor 112 forms the loop. In the embodiment of FIG. 1, each of the first and second terminals 120, 122 are formed of, or are connected to, copper pads for application of a voltage thereto. In the embodiment of FIG. 1, terminals 120, 122 are provided at a corner on the surface 110 of the protective layer 108 but these may be situated at any convenient location. Alternative arrangements for the terminals for the test electrical conductor 112 are available and just such alternative arrangement is described with reference to FIG. 2 below.

The test electrical conductor 112 could comprise, in alternative embodiments, a straight line, to give just one example, from one side 124 to another side 126 of the surface 110 of the protective layer 108. Application of a voltage to such a test electrical conductor, if damaged, may provide an indication of defects in the package. More specifically, it may provide an indication of defects in the vicinity of the test electrical conductor 112. The test electrical conductor 112 may be formed in almost any desired manner to be located in an area where cracks and/or delamination may form and where it would be desirable to test for such cracks and/or delamination.

In the embodiment of FIG. 1, the protective layer 110 has a peripheral edge 128 and at least a part 130 of the test electrical conductor 112 is disposed proximate the peripheral edge 128, the benefit of which will become apparent from the following discussion. Additionally, in the embodiment of FIG. 1, the protective layer 108 has a (second) region 132 that, when the protective layer 108 is formed over the substrate 102, will be adjacent the first region 118 on the substrate 102, mentioned above. At least a part (for example, parts 134 or 136) of the test electrical conductor 112 is disposed proximate region 132 of the protective layer 108, the benefit of which will also become apparent from the following discussion.

As noted above, elements in the figures are illustrated for simplicity and clarity and have not necessarily been drawn to scale. In practice, the skilled reader will realize that the protective layer 108 which, in the embodiment of FIG. 1, is formed of solder mask material, may be of significantly less depth than a depth of the substrate 102.

The semiconductor package 100 may be subjected to stresses during any one of a number of manufacturing processes which include mechanical damage caused by mishandling by an operator, such as bending and dropping. Additionally, subsequent manufacturing processes in which the package is utilized may subject the package to further stresses. For instance, the process of fixing semiconductor package 102 to a printed circuit board (PCB), not shown, may utilize heat such as by heating in a reflow oven thereby subjecting the package to thermal stresses. For instance, in a reflow process, the package may be heated to temperatures of the order of 260° C. Further, in such heating processes, moisture may be drawn from the package and this may cause cracks or other degradation in protective layer 108. Such defects can cause electrical and/or mechanical failure of semiconductor packages leading to returns of the packages.

Application of a voltage to test electrical conductor 112 may allow detection of cracks in protective layer 108. Should the package be damaged, the test electrical conductor may also be damaged (such as by breaking) and, on application of a voltage thereto, an open-circuit condition may be detected because of the break in the conductor. Thus, faulty packages can be detected prior to shipment to customers. If test electrical conductor 112 is not damaged, a short circuit condition will be detected, which may give an indication of the package is in a good condition. Application of voltage to the test electrical conductor may be by any suitable means, such as with a digital multimeter.

Examples of preferred arrangements of the test electrical conductors in or on the protective layer are discussed with reference to FIG. 3 and FIG. 4.

Figure 2:
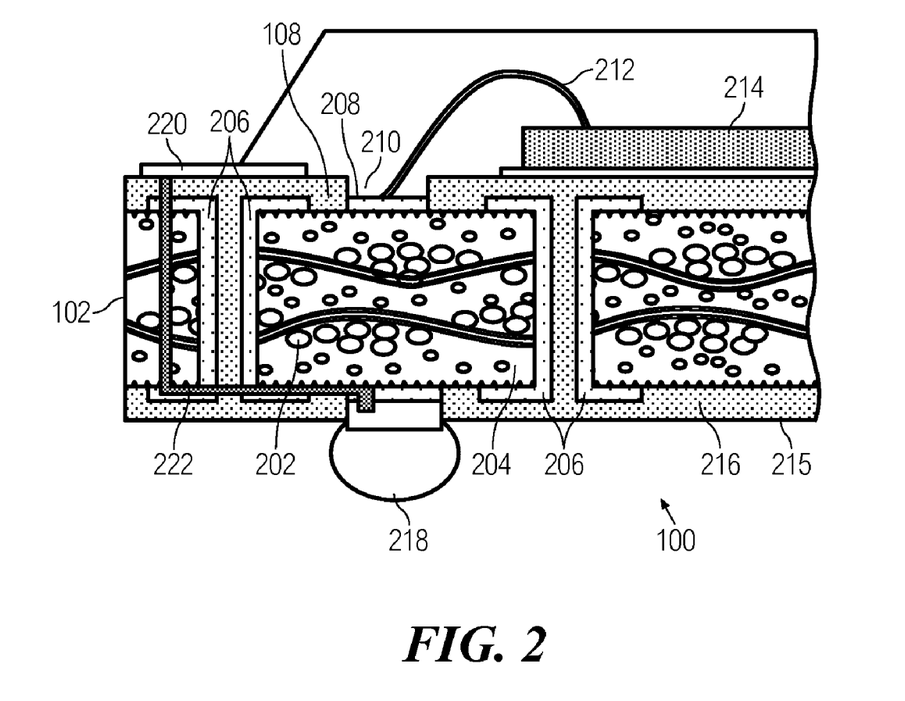
FIG. 2 is a greatly enlarged cross-sectional view of a portion of the semiconductor package of FIG. 1.

Referring now to FIG. 2, an alternative partial view of semiconductor package 100 is given. This view provides a sectional detail of substrate 102. Substrate 102 of the present embodiment is made up of glass fibers 202 and epoxy resin 204 but, as mentioned above, other substrate compositions are contemplated.

Substrate 102 comprises vias 206 and plating traces 208 (the plurality of electrical conductors 106) formed within or on substrate 102 in accordance with processes known to the skilled reader.

Soldermask is applied as protective layer 108 over that to protect and provide insulation for the plating traces. Openings 210 may be formed in the soldermask layer 108 for wire bonding using wire bonds 212 from the die 214 to the vias 206. Additionally, soldermask 215 may also be provided on underside 216 of substrate 102 for use in the process of attaching solderballs 218 to the semiconductor package 100, as will be known to the skilled reader. In the present embodiment, substrate 102 need not be provided with solderballs 218 and these are provided for illustrative purposes only.

In the embodiment of FIG. 2, the test electrical conductor (not shown) terminates in copper pad 220. In an alternative configuration, the test electrical conductor is connected through via 206 in substrate 102 for connection to a solderball 218 through which a test voltage for testing semiconductor package 100 can be applied in accordance with the techniques disclosed herein. In such arrangements, the test electrical conductor 112 comprises a first end and a second end, the first end being connected to a first via in the substrate and the second end being connected to a second via in the substrate, the first via and the second via each being arranged for connection to respective solderballs. Line 222 in FIG. 2 indicates schematically that an electrically-conductive path is present from the test electrical conductor on the upper surface (as viewed in FIG. 2) to the solderballs 218.

Dedicated solderballs 218 may be provided for the testing purpose or it is possible to use solderballs intended to be bonded during a reflow process.

After the wire bonding process, package 100 may be subjected to an encapsulation process, where the package is encapsulated in encapsulating material using any one of known encapsulation processes.

Figure 3:
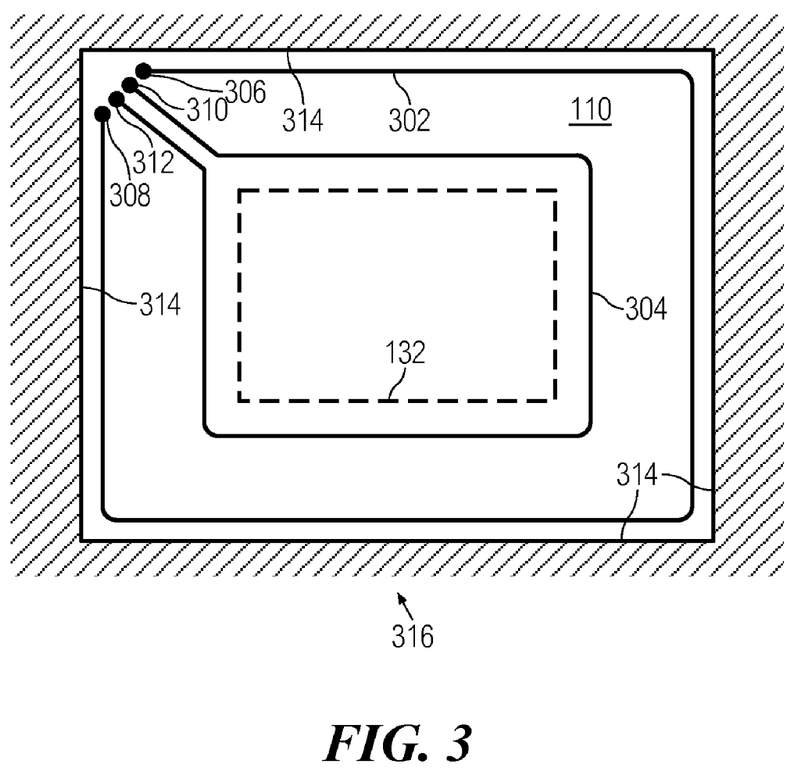
FIG. 3 is a top plan view of a semiconductor package in accordance with another embodiment of the present invention.

Referring now to FIG. 3, further exemplary arrangements for the test electrical conductor are discussed. FIG. 3 provides another view (an alternative to that of the view in FIG. 1c) of surface 110 of protective layer 108. Surface 110 has formed thereon one or both of test electrical conductors 302, 304. When provided, test electrical conductor 302 terminates in copper pads 306, 308. When provided, test electrical conductor 304 terminates in copper pads 310, 312. It will of course be appreciated that the provision of copper pad terminals 306, 308, 310, 312, are illustrative only and, as noted above, solderballs may be provided as terminals for the test electrical conductors 302, 304.

Protective layer 108 has plural peripheral edges 314 and is encapsulated in encapsulating material 316, shown only in part for ease of understanding. Concerning test electrical conductor 302 this also forms a loop, at least a part of the electrical conductor being disposed proximate peripheral edge 314. In the embodiment of FIG. 3, test electrical conductor 302 is advantageously disposed proximate the peripheral edges 314 over almost the entire length of the conductor 302. Application of a test voltage to test electrical conductor 302 may detect any defects at the edge of protective layer 108 and any such defects may cause damage to conductor 302, such as by breaking it. As discussed above, such defects may cause delamination between protective layer 108 and encapsulating material 316 and it may be desirable to detect such defects. When the conductor is provided proximate plural peripheral edges, greater coverage of the edges where cracking is more likely to occur is provided.

In terms of proximity to peripheral edge 314, test electrical conductor 304 may preferably be disposed on the surface so as to allow detection of any damage or delamination caused by cracks which may appear in the outer edge of the package. The inventors have found acceptable results may be achieved if test electrical conductor 302 (or at least part thereof) is disposed between 1 mm and 3 mm from peripheral edge 314. If the conductor is disposed too far from the peripheral edge, then it may be that cracking does not penetrate that far into the package and may remain undetected.

Protective layer 108 also has (second) region 132 disposed adjacent (for example, over) first region on surface 104 of substrate 102 (not shown in FIG. 3) where terminals for electrical conductors are located. These terminals include terminals for connection to a die (also not shown in FIG. 3) and can cause irregularities on surface 110 of protective layer 108. Such irregularities may cause adhesion failure or delamination between protective layer 108 and encapsulating material 316. Therefore, test electrical conductor 304 forms a loop around at least part of region 132. In the embodiment of FIG. 3, test electrical conductor 304 forms a loop substantially enclosing region 132. Disposing or positioning test electrical conductor 304 proximate this region can cause the test electrical conductor 304 to be damaged if significant irregularities form on protective layer 108 caused by the terminals 116 (not shown in FIG. 3) projecting above surface 104 of substrate 102. Application of a test voltage to test electrical conductor 304 may detect any defects in test electrical conductor 304, such as breaking, thereby causing an open-circuit condition to be detected when a voltage is applied to test electrical conductor 304.

In terms of proximity of electrical conductor 304 to region 132, test electrical conductor 304 may preferably be disposed on the surface so as to allow detection of any delamination between the substrate at the die area and protective layer 108. The inventors have found that acceptable results may be achieved if test electrical conductor 304 (or at least a part thereof) is disposed between 1 mm and 3 mm outside the region 132. If test electrical conductor 304 is disposed at a distance closer to region 132 than that, then it is possible irregularities in thickness of protective layer 108 may cause a short circuit between test electrical conductor 304 and electrical conductors 106. If disposed farther out from region 132 than that, then it is possible the conductor is disposed too far away from the region to detect any delamination which may have occurred due to the terminals 116.

In one embodiment the test electrical conductors 302, 304 are provided together on surface 110 of protective layer 108. That is, semiconductor package 100 comprises a first test electrical conductor and a second test electrical conductor. The protective layer has a peripheral edge and at least a part of a first one of the first and second electrical conductors is disposed proximate the peripheral edge. The substrate has a first region in which terminals for the plurality of electrical conductors are disposed and the protective layer has a second region disposed adjacent the first region. At least a part of a second one of the first and second electrical conductors is disposed proximate the second region.

Figure 4:
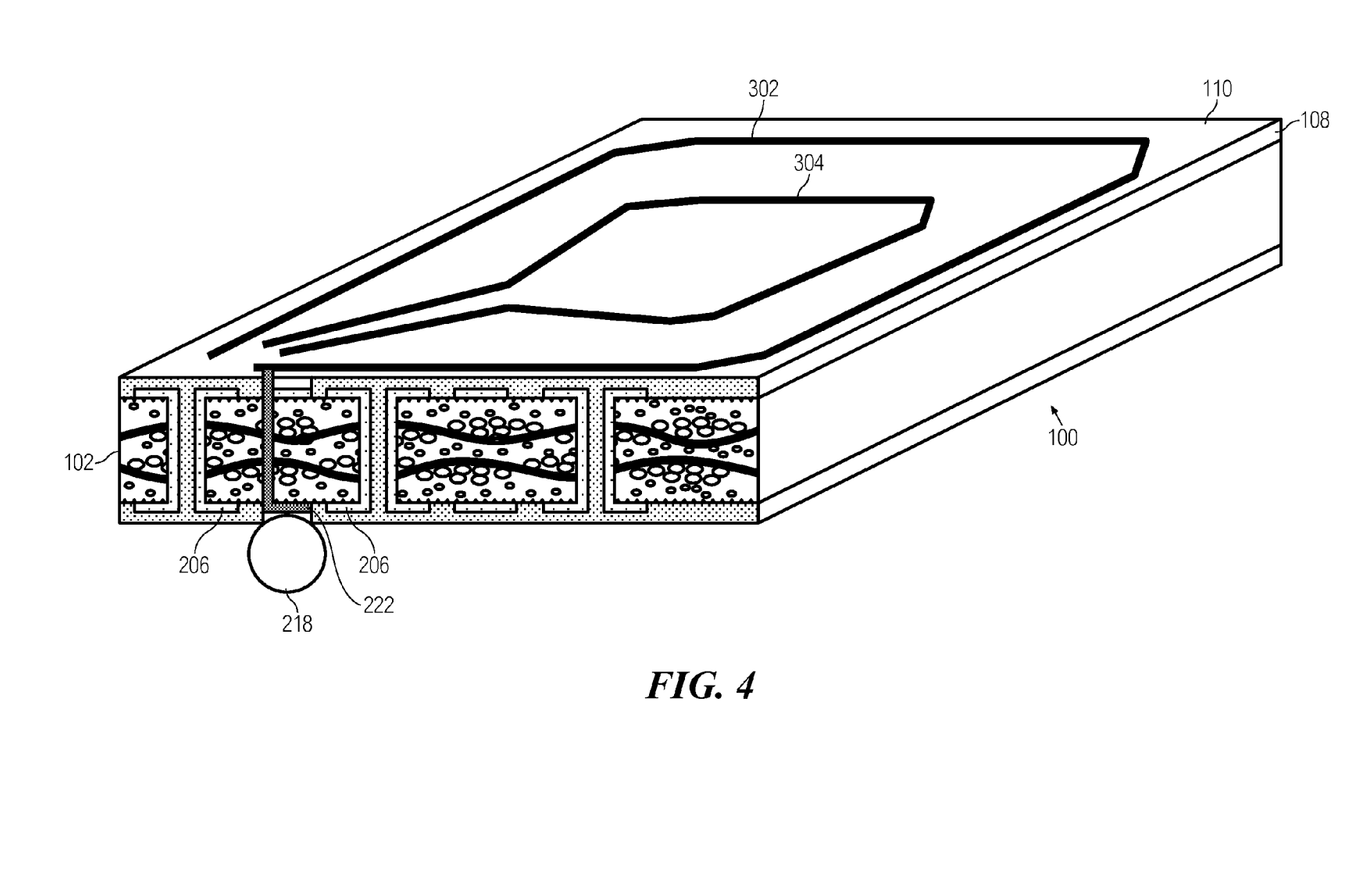
FIG. 4 is a partially cut-away perspective view of the semiconductor package of FIG. 3.

FIG. 4 provides a perspective view of the embodiment of FIG. 3 in which test electrical conductors 302, 304 are formed on surface 110 of protective layer 108. Conductors 302, 304 are arranged for connection to respective solderballs 218 through vias 206 in substrate 102. Line 222 provides an indication of the electrical path between the upper surface of semiconductor package 100 and solderballs 218.

Figure 5:
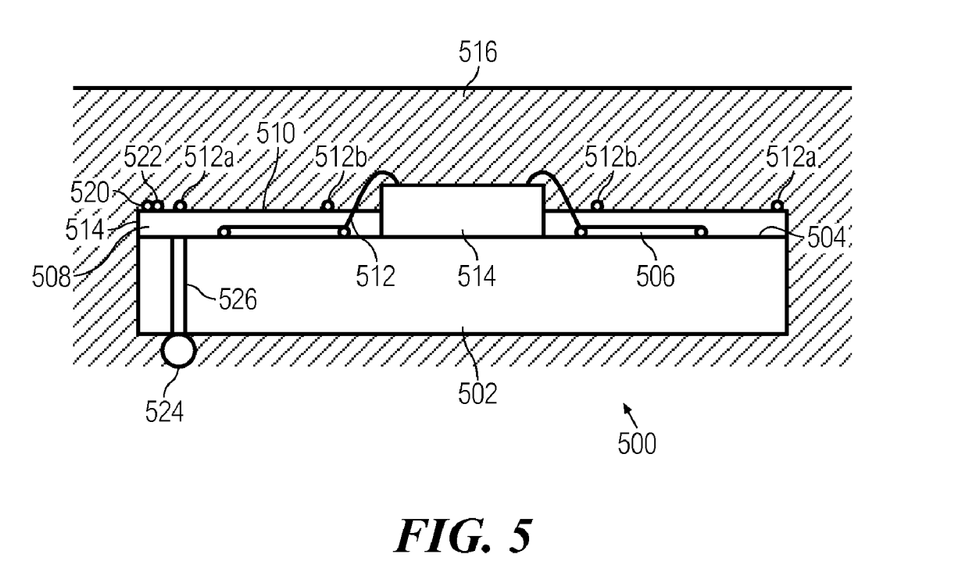
FIG. 5 is a cross-sectional side view of an assembled semiconductor device in accordance with another embodiment of the present invention.

FIG. 5 illustrates an integrated circuit package 500 in accordance with another embodiment of the present invention. Integrated circuit package 500 comprises substrate 502 including a wire layout pattern 506 formed thereon and a soldermask layer 508, also formed thereon using techniques known to the person skilled in the art. In the embodiment of FIG. 5, an integrated circuit 514 is attached to a surface 504 of substrate 502 and electrically connected, using wire bonds 512, to wire layout pattern 506. In the embodiment of FIG. 5, wire layout pattern 506 comprises the plating traces for conducting electricity between the integrated circuit 514 and solderballs 524. Encapsulating material 516 covers at least the integrated circuit 514 and the soldermask layer 508. In some embodiments, soldermask layer 508 does not cover wire layout pattern in which case encapsulating material 516 also covers any portion of wire layout pattern 506 not covered by soldermask layer 508.

A plurality of crack seal rings 512a and 512b are formed on a surface 510 of soldermask layer 508. The plurality of crack seal rings comprise copper traces and may be formed on the soldermask surface with a sputtering process. The crack seal rings may also be formed using other techniques described above in relation to the test electrical conductors of FIG. 1. The plurality of crack seal rings includes the first ring 512a, at least a portion of which is formed proximate an edge 514 of the soldermask layer for detecting soldermask cracks. In the embodiment of FIG. 5, the layout of crack seal ring 512a may be similar to that of test electrical conductor 302 of FIG. 3. The plurality of crack seal rings also includes the second ring 512b, at least a portion of which is formed proximate the wire layout pattern for detecting delamination between the mold encapsulation 516 and the soldermask surface 510. In the embodiment of FIG. 5, the layout of crack seal ring 512b may be similar to that of test electrical conductor 304 of FIG. 3. A plurality of terminals 520, 522 are connected to the crack seal rings for permitting electrical connection—such as by a digital multimeter—to the crack seal rings. The benefits of the arrangement of FIG. 5 will be apparent from the foregoing discussion in relation to FIGS. 1 to 4.

The plurality of terminals 520, 522 may comprise of plated copper pads. Additionally or alternatively, solderballs 524 may be provided on an underside of the integrated circuit package 500 as the plurality of terminals, connected to the upper side of the package 500 through vias 526.

By now it should be appreciated that there has been provided a novel method of testing a semiconductor package by application of the test voltage to a test electrical conductor of a protective layer.

Although the invention is described herein with reference to specific embodiments, various modifications and changes can be made without departing from the scope of the present invention as set forth in the claims below. For example, more than one or two electrical conductors may be used, where the test electrical conductors have a different layout on the protective layer depending on the area which is to be tested for damage. Additionally, the test electrical conductors may be provided in any one of several forms including conductive traces sputtered onto a surface of the protective layer. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A semiconductor package, comprising:
a substrate;
a plurality of electrical conductors on a surface of the substrate for conducting electrical current between a die and a plurality of solderballs; and
a protective layer formed on the surface of the substrate for protecting the electrical conductors, the protective layer comprising a test electrical conductor, wherein the protective layer has plural peripheral edges and the test electrical conductor forms a loop, at least a substantial portion thereof being disposed proximate the plural peripheral edges.

2. The semiconductor package of claim 1, wherein the test electrical conductor comprises a first and second ends, each of which are connected to copper pad terminals for application of a voltage thereto.

3. The semiconductor package of claim 1, wherein the test electrical conductor comprises a first end and a second end, the first end being connected to a first via in the substrate and the second end being connected to a second via in the substrate, the first via and the second via each being arranged for connection to respective solderballs.

4. The semiconductor package of claim 1, wherein the substrate has a first region in which terminals for the plurality of electrical conductors are disposed, and the protective layer has a second region disposed adjacent the first region, at least a part of the test electrical conductor being disposed proximate the second region.

5. The semiconductor package of claim 4, wherein the test electrical conductor forms a loop around at least a part of the second region.

6. A semiconductor package, comprising:
a substrate;
a plurality of electrical conductors on a surface of the substrate for conducting electrical current between a die and a plurality of solder balls; and
a protective layer formed on the surface of the substrate for protecting the electrical conductors, the protective layer comprising first and second test electrical conductors, wherein the protective layer has a peripheral edge and at least a part of a first one of the first and second electrical conductors is disposed proximate the peripheral edge, and wherein the substrate has a first region in which terminals for the plurality of electrical conductors are disposed, and the protective layer has a second region disposed adjacent the first region, at least a part of a second one of the first and second electrical conductors being disposed proximate the second region.

7. An integrated circuit package, comprising:
a substrate including a wire layout pattern and a solder mask layer;
an integrated circuit attached to a surface of the substrate and electrically connected to the wire layout pattern;
encapsulating material covering at least the integrated circuit and the solder mask layer;
a plurality of crack seal rings formed on the solder mask surface, wherein the crack seal rings comprise copper traces, and wherein the plurality of crack seal rings includes a first ring, at least a portion of which is formed proximate an edge of the solder mask layer, for detecting solder mask cracks and a second ring, at least a portion of which is formed proximate the wire layout pattern, for detecting delamination between the encapsulation material and the solder mask surface; and
a plurality of terminals connected to the crack seal rings for permitting electrical connection to the crack seal rings.

8. The integrated circuit of claim 7, wherein the plurality of crack seal rings are formed on the solder mask surface with a sputtering process.

9. The integrated circuit of claim 7, wherein the plurality of terminals comprise solderballs.

10. The integrated circuit of claim 7, wherein the plurality of terminals comprises plated copper pads.

* * * * *